(12) United States Patent
Suzuki

(10) Patent No.: US 10,387,377 B2
(45) Date of Patent: Aug. 20, 2019

(54) COMPUTERIZED METHODS OF DATA COMPRESSION AND ANALYSIS

(71) Applicant: Takashi Suzuki, Scottsdale, AZ (US)

(72) Inventor: Takashi Suzuki, Scottsdale, AZ (US)

(*) Notice: Subject to any disclaimer, the term of this patent is extended or adjusted under 35 U.S.C. 154(b) by 117 days.

(21) Appl. No.: 15/600,495

(22) Filed: May 19, 2017

(65) Prior Publication Data

US 2018/0336217 A1 Nov. 22, 2018

(51) Int. Cl.
| | |
|---|---|
| G06F 16/00 | (2019.01) |
| G06F 16/174 | (2019.01) |
| G06F 16/22 | (2019.01) |
| G06F 16/951 | (2019.01) |
| H03M 7/30 | (2006.01) |

(52) U.S. Cl.
CPC ...... *G06F 16/1744* (2019.01); *G06F 16/2246* (2019.01); *G06F 16/951* (2019.01); *H03M 7/3088* (2013.01); *G06F 16/00* (2019.01); *H03M 7/6017* (2013.01)

(58) Field of Classification Search
CPC . H03M 7/3084; H03M 7/40; G06F 17/30153; G06F 12/0802; G06F 11/1446; G06F 3/0483; G06F 16/1744; H04L 69/04
See application file for complete search history.

(56) References Cited

U.S. PATENT DOCUMENTS

| | | |
|---|---|---|
| 5,260,693 A | 11/1993 | Horsley |
| 5,389,922 A | 2/1995 | Seroussi et al. |
| 5,594,435 A | 1/1997 | Remillard |
| 5,617,552 A | 4/1997 | Garber et al. |
| 5,704,060 A | 12/1997 | Del Monte |
| 5,884,269 A | 3/1999 | Cellier et al. |
| 5,995,954 A | 11/1999 | Loos |

(Continued)

FOREIGN PATENT DOCUMENTS

| | | |
|---|---|---|
| CN | 100595596 C | 3/2010 |
| KR | 10-1023536 B1 | 3/2011 |

(Continued)

OTHER PUBLICATIONS

Horspool, R. Nigel and Cormack, Gordon V.; Constructing Word-Based Text Compression Algorithms; Data Compression Conference, 1992.

(Continued)

*Primary Examiner* — Etienne P Leroux
(74) *Attorney, Agent, or Firm* — Louis J. Hoffman; William E. Markov

(57) ABSTRACT

A computerized method and apparatus compresses symbolic information, such as text. Symbolic information is compressed by recursively identifying pairs of symbols (e.g., pairs of words or characters) and replacing each pair with a respective replacement symbol. The number of times each symbol pair appears in the uncompressed text is counted, and pairs are only replaced if they appear more than a threshold number of times. In recursive passes, each replaced pair can include a previously substituted replacement symbol. The method and apparatus can achieve high compression especially for large datasets. Metadata, such as the number of times each pair appears, generated during compression of the documents can be used to analyze the documents and find similarities between two documents.

33 Claims, 5 Drawing Sheets

(56) References Cited

U.S. PATENT DOCUMENTS

| | | | |
|---|---|---|---|
| 6,054,943 | A | 4/2000 | Lawrence |
| 6,356,660 | B1 | 3/2002 | Shannon |
| 6,400,289 | B1 | 6/2002 | Banerji |
| 6,597,812 | B1 | 7/2003 | Fallon et al. |
| 6,674,908 | B1 | 1/2004 | Aronov |
| 6,720,894 | B2 | 4/2004 | Wilson et al. |
| 6,804,401 | B2 | 10/2004 | Nelson et al. |
| 7,365,658 | B2 | 4/2008 | Todorov et al. |
| 7,375,662 | B2 | 5/2008 | Wilson et al. |
| 7,428,341 | B2 | 9/2008 | Suzuki et al. |
| 7,515,762 | B2 | 4/2009 | Suzuki et al. |
| 8,108,204 | B2 | 1/2012 | Gabrilovich et al. |
| 8,373,584 | B2 | 2/2013 | Trezise et al. |
| 8,924,330 | B2 | 12/2014 | Antebi et al. |
| 9,390,098 | B2 | 7/2016 | Teerlink |
| 2002/0152219 | A1* | 10/2002 | Singh .................... H04L 69/04 |
| 2002/0154040 | A1 | 10/2002 | Vataja |
| 2003/0131184 | A1* | 7/2003 | Kever ................. G06F 12/0802 711/100 |
| 2006/0181443 | A1* | 8/2006 | Lee ....................... H03M 7/40 341/90 |
| 2009/0271181 | A1* | 10/2009 | Balegar ............... H03M 7/3084 704/10 |
| 2014/0282205 | A1* | 9/2014 | Teplitsky .............. G06F 3/0483 715/776 |
| 2016/0210508 | A1 | 7/2016 | Ideuchi et al. |
| 2017/0139947 | A1* | 5/2017 | Abed ................ G06F 17/30153 |
| 2017/0187734 | A1* | 6/2017 | Lee ................... G06F 11/1446 |

FOREIGN PATENT DOCUMENTS

| | | |
|---|---|---|
| WO | 2000/035098 A1 | 6/2000 |
| WO | 2007/050018 A1 | 5/2007 |

OTHER PUBLICATIONS

Dictionary Techniques (Lempel-Ziv Codes); at http://www.mini.pw.edu.pl/~herbir/www/?download=notes%208.pdf; 2014.

Keramidas, et al.; Dynamic Dictionary-Based Data Compression for Level-1 Caches; Architecture of Computing Systems—ARCS 2006; Lecture Notes in Computer Science, vol. 3894; 2006.

Arora, Nitin and Arora, Esha; Dynamic Word Based Data Compression Algorithm for Text Using Tagged SUB Optimal Code (TSC); International Journal of Advanced Technology & Engineering Research (IJATER) 1st International Conference on Research in Science, Engineering & Management (IOCRSEM 2014) 2014.

Kosko, Bart; Adaptive bidirectional associative memories; Applied Optics; vol. 26, No. 23; pp. 4947-4960; Dec. 1, 1987.

Kosko, Bart; Bidirectional Associative Memories; IEEE Transactions on Systems, Man, and Cybernetics; vol. 18, No. 1; Jan./Feb. 1988.

Manger, Robert and Puljic, Krunoslav; Multilayer Perceptrons and Data Compression; Computing and Informatics; vol. 26, pp. 45-62; 2007.

You Can Say That Again!—Text Compression; Computer Science Unplugged at http://csunplugged.org/wp-content/uploads/2014/12/unplugged-03-text_compression.pdf; 2002.

Sayood, Khalid; Introduction to Data Compression (Chapters 1, 3, and 5); Elsevier Inc.; 2012.

Lin, Ming-Bo; A Hardware Architecture for the LZW Compression; Journal of VLSI Signal Processing 26, pp. 369-381; 2000.

Mesut, Altan and Carus, Aydin; A New Approach to Dictionary-Based Lossless Compression; International Scientific Conference-Gabrovo; Nov. 18-19, 2004.

Ye, Yan and Cosman, Pamela; Dictionary design for text image compression with JBIG2; IEEE Transactions on Image Processing; vol. 10, No. 6; Jun. 2001.

Kuruppu, Shanika et al.; Iterative Dictionary Construction for Compression of Large DNA Data Sets; IEEE/ACM Transactions on Computational Biology and Bioinformatics; vol. 9, No. 1; pp. 137-149; Jan./Feb. 2012.

Storer, James A.; Lossless Image Compression Using Generalized LZ1-Type Methods; Proceedings IEEE Data Compression Conference; pp. 290-299; 1996.

Larsson, N. Jesper and Moffat, Alistair; Off-Line Dictionary-Based Compression; Proceedings of the IEEE; vol. 88, No. 11, pp. 1722-1732; Nov. 2000.

Claude, Francisco and Navarro, Gonzalo; Self-Indexed Text Compression using Straight-Line Programs; Fundamenta Informaticae XXI; IOS Press; pp. 1001-1023; 2001.

Kieffer, J.C. et al; Universal lossless compression via multilevel pattern matching; IEEE Transactions on Information Theory, vol. 46, No. 4; pp. 1227-1245; Jul. 1, 2000.

Deorowicz; Sebastian; Universal lossless data compression algorithms; Doctor of Philosophy Dissertation; Silesian University of Technology Faculty of Automatic Control, Electronics and Computer Science Institute of Computer Science; 2003.

Shibata, Yusuke et al.; Speeding Up Matching by Text Compression; CIAC2000, LNCS 1767, pp. 306-315; 2000.

Clustor Case Studies: Byte Pair Encoding: The Problem; http://web.archive.org/web/20031027234441/http://www.csse.monash.edu.au/cluster/RJK/Compress/problem.html; Oct. 27, 2003.

Cinque, L. et al.; Scalability and Communication in Parallel Low-Complexity Lossless Compression, Mathematics in Computer Science (Abstract only); vol. 3, Issue 4, pp. 391-406, Jun. 2010—406.

* cited by examiner

FIG. 2

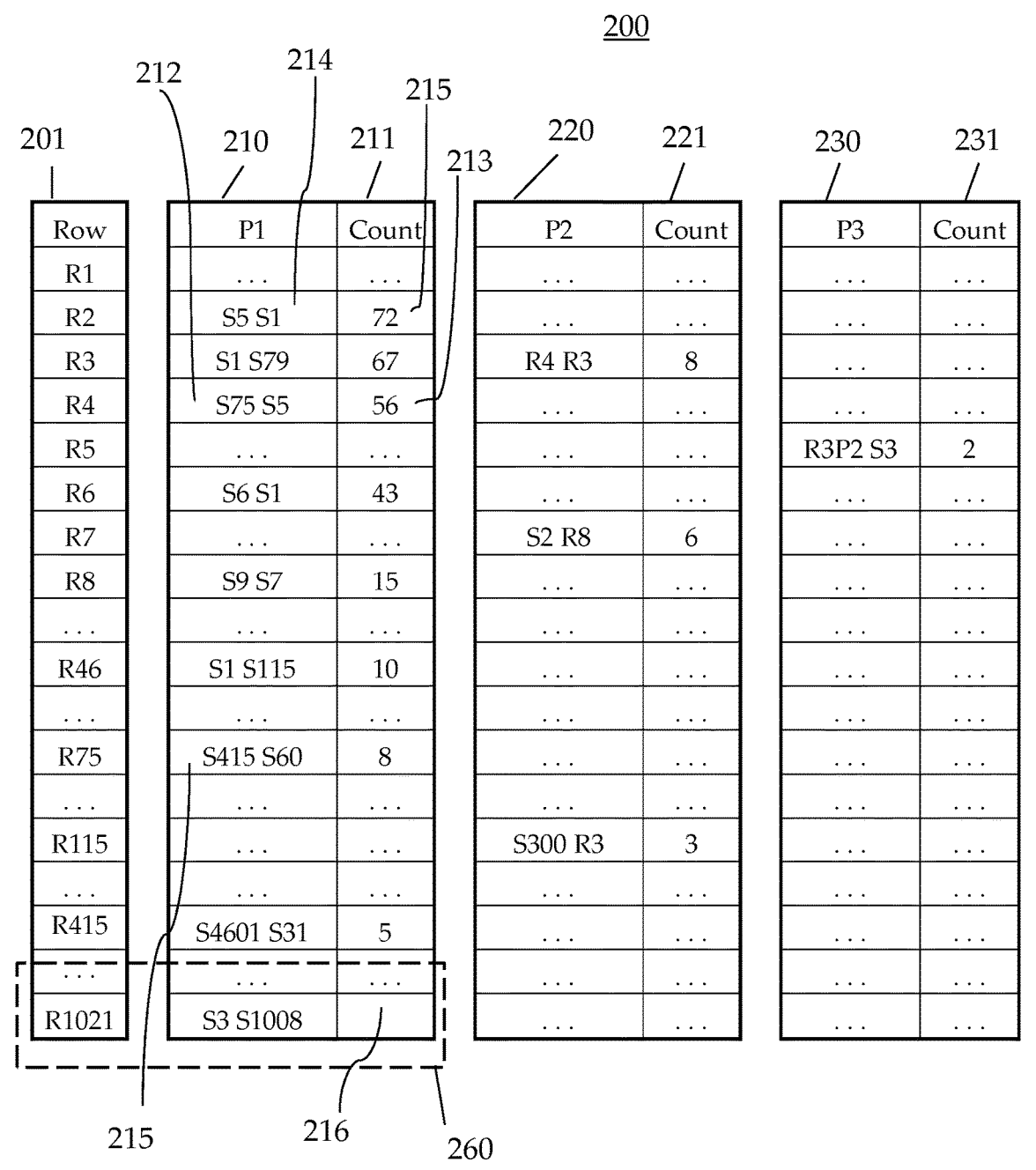

| Row | P1 | Count | P2 | Count | P3 | Count |
|---|---|---|---|---|---|---|
| R1 | ... | ... | ... | ... | ... | ... |
| R2 | S5 S1 | 72 | ... | ... | ... | ... |
| R3 | S1 S79 | 67 | R4 R3 | 8 | ... | ... |
| R4 | S75 S5 | 56 | ... | ... | ... | ... |
| R5 | ... | ... | ... | ... | R3P2 S3 | 2 |
| R6 | S6 S1 | 43 | ... | ... | ... | ... |
| R7 | ... | ... | S2 R8 | 6 | ... | ... |
| R8 | S9 S7 | 15 | ... | ... | ... | ... |
| ... | ... | ... | ... | ... | ... | ... |
| R46 | S1 S115 | 10 | ... | ... | ... | ... |
| ... | ... | ... | ... | ... | ... | ... |
| R75 | S415 S60 | 8 | ... | ... | ... | ... |
| ... | ... | ... | ... | ... | ... | ... |
| R115 | ... | ... | S300 R3 | 3 | ... | ... |
| ... | ... | ... | ... | ... | ... | ... |
| R415 | S4601 S31 | 5 | ... | ... | ... | ... |
| ... | ... | ... | ... | ... | ... | ... |
| R1021 | S3 S1008 | | ... | ... | ... | ... | ary analysis.

COMPUTERIZED METHODS OF DATA COMPRESSION AND ANALYSIS

BACKGROUND

The field of the present invention relates to data compression and analysis. Specifically, the invention relates to lossless compression of text and other information that can be represented by symbols.

Previous text compression techniques are usable on only one file or document at a time. Such techniques do not scale easily to enormous data sets, i.e., "Big Data," or where data is spread across many different containers. Also, previous techniques do not track the number of times a particular symbol or string of symbols appears in the uncompressed text. The number of times a particular symbol or string appears is valuable information that is useful for improving space savings, reducing processing time, and conducting contextual analysis.

SUMMARY

An example embodiment compresses symbolic information that is organized into a plurality of documents. Each of the uncompressed documents has a plurality of symbols. A document can be a string of symbols of any length (e.g., a sentence, paragraph, or text file). A symbol can be any code that constitutes or carries information (e.g., a letter, number, non-alphanumeric character, syllable, or word).

The example embodiment operates on an input document by identifying two adjacent symbols in the document as a symbol pair. The example embodiment stores each unique symbol pair in a compression dictionary. The compression dictionary associates each stored symbol pair with a respective replacement symbol. The example embodiment also maintains a count of the number of times each unique symbol pair appeared in the input document. The example embodiment produces a compressed output document by replacing symbol pairs with their associated replacement symbols if the count for the symbol pair exceeds a threshold.

Some embodiments are programmed to repeat the compression process by using the output document as an input document for an additional pass. Certain embodiments recursively perform additional passes until no further replacements can be made (i.e., in the final pass, the output document is identical to the input document). Symbol pairs identified in recursive passes can include replacement symbols from a previous pass.

Some embodiments are programmed to be applied to multiple documents. In fact, the compression ratio improves as the size of the uncompressed data increases. The larger the data set, the more likely it is that the count associated with any given symbol pair will exceed the threshold, which results in more replacements and higher compression. Compression is optimized, in some of these embodiments, when the process recurs on all the documents until no further replacements are possible.

Some embodiments increase space savings and decrease the lookup time needed to access the compression dictionary by using, as a replacement symbol, the address of the replaced symbol pair in the compression dictionary.

Some embodiments sort the entries in the compression dictionary based on the count of the number of times a symbol pair appeared. The sorting is done to place the most frequently appearing symbol pairs in more accessible memory locations than less frequently appearing symbol pair. Sorting decreases lookup times during the replacement phase.

Some embodiments use patterns of replacement symbols and the count of the number of times certain symbol pairs appeared to analyze content.

Objects and advantages pertaining to computerized methods of data compression and analysis may become apparent upon referring to the example embodiments illustrated in the drawings and disclosed in the following written description or appended claims.

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

BRIEF DESCRIPTION OF THE DRAWINGS

FIG. 2 is a visual representation of a compression dictionary used in the embodiment of FIG. 1.

The embodiments depicted are shown schematically. The embodiments shown are examples only and should not be construed as limiting the scope of the present disclosure or appended claims.

DETAILED DESCRIPTION

Embodiments of the data compression and analysis technique can be programmed in computer code as a set of computer instructions. When running on a computer, the computer instructions control a computer processor and cause it to perform the functions described herein. The computer instructions (e.g., computer software) can be stored in any computer memory accessible to the computer or encoded in computer hardware. Some embodiments are instantiated in special purpose computers or dedicated computer appliances. The documents on which the embodiments operate can be stored in the same or a different computer memory accessible to the computer system.

An example embodiment analyzes uncompressed text to identify adjacent pairs of symbols. The example embodiment replaces occurrences of a pair of symbols that appears more than a predefined number of times with an associated replacement symbol. Symbols can be alphanumeric characters, discrete groups of alphanumeric characters such as syllables or words, or any code that constitutes and carries information.

Figure 1:
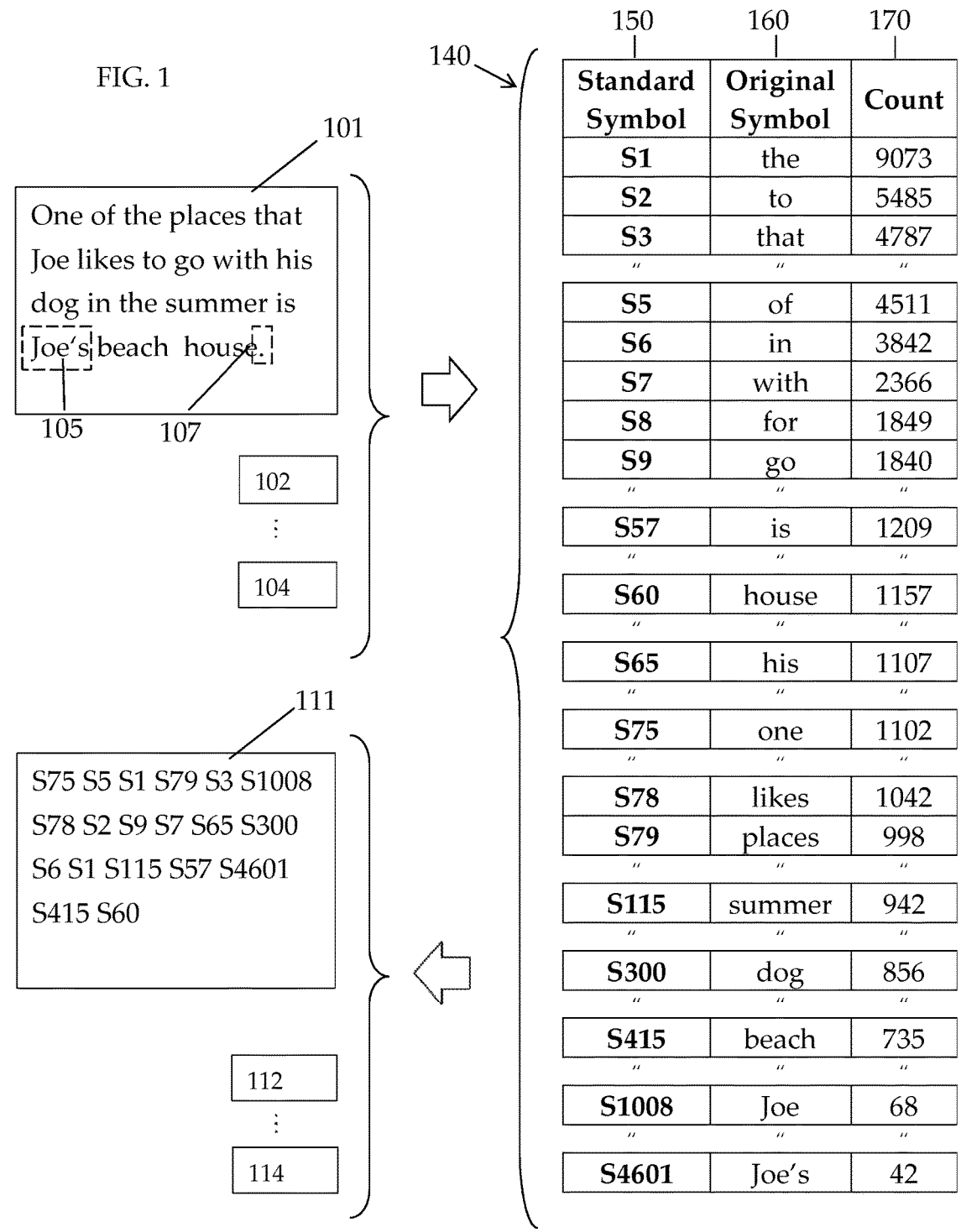
FIG. 1 is a visual representation of a text standardization process applied by an embodiment.

In some embodiments, the original symbols in the uncompressed text are replaced with standard symbols during a preliminary phase. FIG. 1 is a representation of how an example embodiment standardizes uncompressed text. In certain circumstances, such as when there is a large variation in the lengths of the original symbols, standardization improves performance during subsequent operations.

The example embodiment of FIG. 1 identifies and counts all occurrences of unique original symbols and stores each unique original symbol. Each original symbol is stored in a standardization memory in association with a standard symbol. In FIG. 1, standardization memory 140 associates an original symbol (in column 160) with its respective standard symbol (in column 150) and a count of how many times each original symbol appears in the uncompressed text (in column 170).

To identify unique original symbols, some embodiments are programmed to interpret certain non-alphanumeric characters (e.g., a space) as denoting a break between two symbols. The example embodiment interprets a space as a break between symbols yet retains the space in the standardized document. For example, document 111 is shown with spaces separating the standard symbols. However, other embodiments drop spaces and certain other non-alphanumeric characters entirely because the location of such characters can be restored or discerned from context. For example, a space between symbols can be inferred and reproduced based on the rules of the algorithm used to identify the original symbols. Likewise, the presence of certain non-alphanumeric characters can be inferred based on the grammatical rules of the language in which the text is written.

Some embodiments interpret certain non-alphanumeric characters as part of a symbol. The example embodiment of FIG. 1 identified text 105 as a symbol even though it contains an apostrophe. Other embodiments identify non-alphanumeric characters as symbols in their own right.

Some embodiments ignore capitalization while processing symbols. Such embodiments provide space savings by storing only a uniform-case version (e.g., lowercase version) of all original symbols. Such embodiments can restore the original text, including restoring capitalization, using grammatical and contextual rules regarding sentence structure and proper nouns.

Some embodiments interpret select symbols as signaling the end of a document. The example embodiment of FIG. 1 identifies the period at 107 as the separator between document 101 and document 102. Alternative embodiments separate text into documents based on carriage returns, paragraphs, cells, fields, records, rows, columns, pages, headings, tags from a markup language, information in a table of contents, or section or chapter markings. Any human-understandable or computer-readable markers or containers can be used to divide the text into documents. Other embodiments operate on documents that are separate computer files.

The example embodiment operates on multiple documents concurrently. Thus, during the standardization process, the example embodiment identifies and counts all occurrences of unique uncompressed symbols in all documents before replacing any of the original symbols in the documents.

The example embodiment replaces the original symbols of document 101 with standard symbols stored in standardization memory 140 to produce standardized document 111. Standardization memory 140 can be created during the standardization of input documents or can be pre-existing. FIG. 1 presents standardization memory 140 in a row-and-column format, but other data storage structures can be used.

The example embodiment sorts the entries in standardization memory 140 according to the counts stored in column 170. The example embodiment sorts the entries before standard symbols are assigned and stored in column 150. Sorting standardization memory 140 improves space savings because the example embodiment can assign shorter standard symbols to the symbols that appear most frequently. Sorting also allows frequently used standard symbols to be stored in highly accessible memory locations, which improves lookup times. After sorting, some embodiments may delete the counts to save space.

FIG. 1 shows the counts stored in column 170 of standardization memory 140. Alternative embodiments store the counts generated during standardization separately from the standardization memory.

A standard symbol can be an address indicating the location of the original symbol in standardization memory 140. Use of an address rather than an arbitrary symbol reduces the requisite memory space because there is no need to store extraneous symbols. Use of addresses as standard symbols also improves processing times during replacement and decompression because the example embodiment need only perform a single memory lookup rather than performing the multiple lookups that are required to translate between standard symbol and replacement symbol. When restoring the text to its original form, each standard symbol directs the example embodiment to the exact memory location of the original symbol.

Use of addresses as standard symbols, when applied after sorting, further improves lookup times because it ensures that more frequently occurring symbols are stored in more accessible memory locations than less frequently occurring symbols.

FIG. 2 is a representation of compression dictionary 200 that is used by the example embodiment to store associations between a unique symbol pair and its replacement symbol. Standardization memory 140 in FIG. 1 is shown stored separately from compression dictionary 200 in FIG. 2. Alternative embodiments can store the standardization memory as part of the compression dictionary.

Compression dictionary 200 is shown structured in rows and columns. Alternative embodiments use other data structures such as relational databases, document-oriented databases, graph databases, key-value stores, object databases, or hierarchical trees to maintain the compression dictionary (and standardization memory if used). Some embodiments use an existing compression dictionary. Other embodiments create the compression dictionary during operation.

Figure 3:
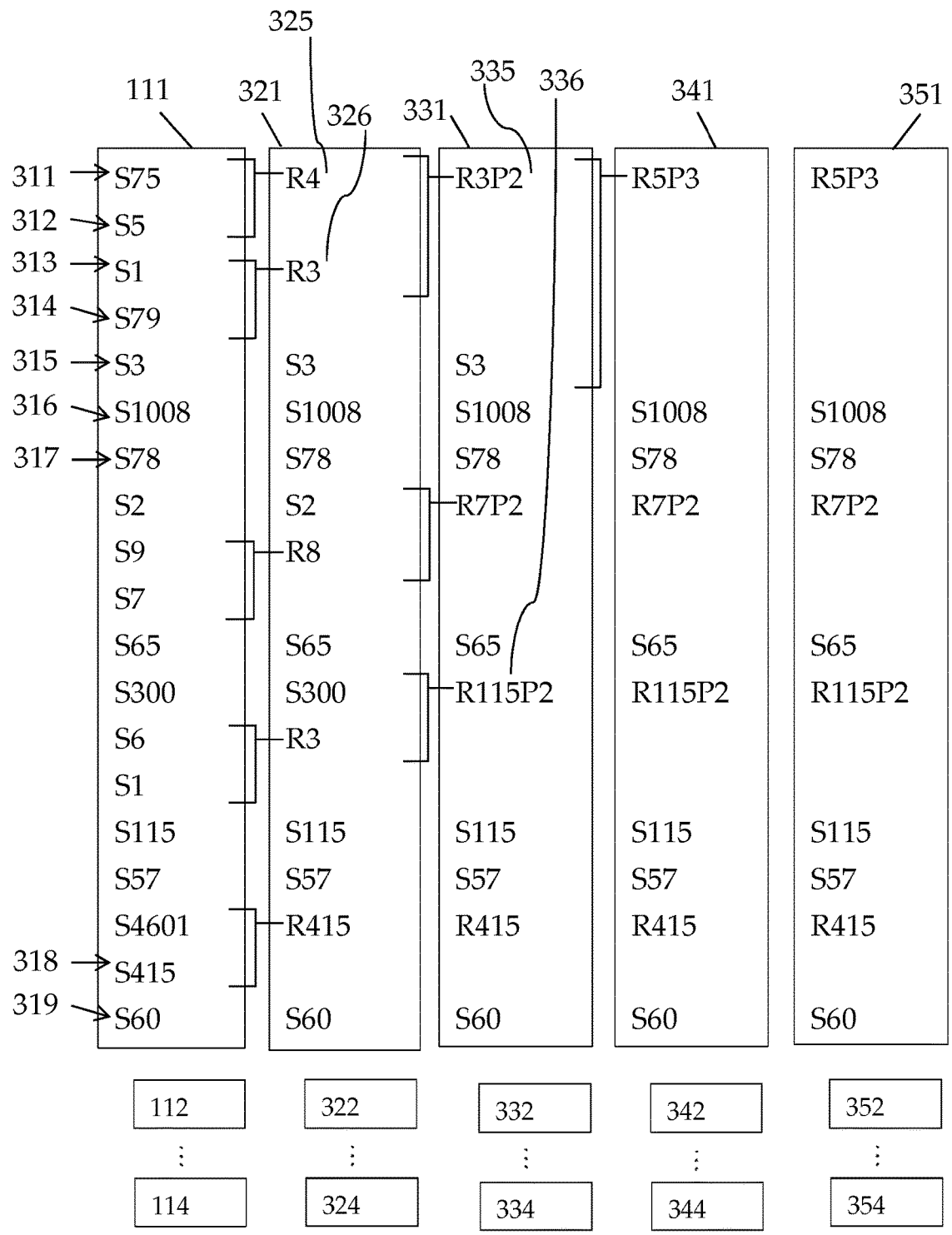
FIG. 3 is a visual representation of operation of the embodiment of FIG. 2.

FIG. 3 is a representation of document 111 as it is operated on by the embodiment of FIG. 2. The example embodiment is programmed to repeat recursively until compression is complete, e.g., until no more pairs of symbols meet the threshold for replacement. The example embodiment operates on document 111 to create output document 351. Numerals 321, 331, and 341 refer to intermediate results before passes of the process carried out by the recursive embodiment; they are called "documents" here for ease of reference but can be deleted or overwritten during the next pass. Documents 112-114 are likewise processed in the same batch as document 111 to produce respective documents 352-354. Documents 322-324, 332-334, and 342-344 represent intermediate results between passes.

During each pass the example embodiment makes through the documents, the example embodiment identifies and counts the occurrence of each unique symbol pair ("the cataloging phase") and replaces symbol pairs with a count exceeding the replacement threshold ("replacement phase"). The example embodiment performs the cataloging phase on all documents before turning to the replacement phase.

Alternative embodiments identify and replace symbol pairs in one operation by processing the text of each document in sequential order. In such alternative embodiments, a pass through a document involves comparing each sequential symbol pair to entries of the compression dictionary. If the comparison results in a match, the compared symbol pair's count is incremented, and if the replacement threshold is met, the symbol pair is replaced with a replacement symbol. If the comparison does not produce a match, the symbol pair is identified as unique and added to the compression dictionary. Because such alternative embodiments do not use replacement symbols until a symbol pair's count exceeds the threshold for replacement, such embodiments schedule replacement of earlier instances of a symbol pair once the symbol pair's count exceeds the replacement threshold.

In the identification or cataloging phase of a pass, the example embodiment identifies symbol pairs in an input document by pairing each symbol with the next adjacent symbol in the document until the last symbol in the document is reached. All symbols, except the first and last symbol, in the input document are therefore included in two symbol pairs: One symbol pair formed from pairing the symbol with the preceding symbol, and one symbol pair formed from pairing the symbol with the following symbol.

For example, when processing document 111, the example embodiment recognizes symbols 311 and 312 as a first pair and symbols 312 and 313 as a second pair. The example embodiment continues pairing symbols until it pairs symbol 318 and 319. The first symbol (symbol 311) and the last symbol (symbol 319) are each only paired with one other symbol (i.e., symbol 312 and symbol 318, respectively). All other symbols in the document are included in two symbol pairs.

Alternative embodiments do not compare every possible pairing of adjacent characters. Rather such embodiments skip symbol pairs having a symbol from the previously compared pair. For example, such embodiments, if operating on document 111, would recognize the pair of symbols 311 and 312, skip over the pair formed by symbols 312 and 313, and recognize the pair of symbols 313 and 314 as the next pair.

Once all pairings have been made for the symbols in documents 111-114, the example embodiment counts the number of times each unique symbol pair appeared in the documents. The example embodiment identifies and counts the unique symbol pairs by inserting every symbol pair into an array and performing a "pivot table" operation on the array to identify and count the number of occurrences of each unique symbol pair.

In each pass, the example embodiment generates a pass-related section in the compression dictionary. For example, referring to FIG. 2, columns 210 and 211 of compression dictionary 200 are the result of the cataloging phase of the first pass. Column 210 stores each unique symbol pair from the text processed in the cataloging phase of the first pass. Column 211 stores the count associated with each symbol.

FIG. 2 presents the count as being stored as a field in compression dictionary 200. A symbol pair's associated count could be stored as an attribute or metadata of the symbol pair, rather than as an entry in the compression dictionary. Alternative embodiments store counts associated with each pair separately from the compression dictionary. The example embodiment does not store a count for symbol pairs that appear only once (see entry 216 in compression dictionary 200). The presence of a symbol pair is sufficient to indicate it has appeared only once.

The example embodiment is programmed to sort the entries of compression dictionary 200 based on the counts of each symbol pair in a manner similar to that described above in connection with standardization of the symbols. In other words, after all symbol pairs are identified from documents 111-114, the example embodiment sorts entries of compression dictionary 200 (FIG. 2) before assigning replacement symbols or making any replacements to produce document 321 (FIG. 3). For the reasons similar to those described above in connection with sorting the standardization memory, the example embodiment achieves space savings and performance benefits by sorting compression dictionary 200.

A replacement symbol can be an address in the compression dictionary where the symbol pair associated with the replacement symbol is stored. In the embodiment of FIG. 2, replacement symbols are formed from a combination of the row identifier (see column 201) and a column identifier. The column identifier indicates the pass during which the symbol pair was identified (P1, P2, P3 in FIG. 2). Use of address-based replacement symbols provides similar benefits to those described in connection with standardization for similar reasons. Alternative embodiments assign unique replacement symbols that are unrelated to the address of the symbol pair.

In some cases, the replacement symbol can be just the portion of the address associated with the row identifier. For example, the replacement symbols from the first pass of the example embodiment are only the row identifier of its respective symbol pair's address. When the example embodiment decompresses a document, it is programmed to associate replacement symbols without a pass identifier as being from the first pass. In example embodiments, replacement symbols from the first pass are inserted into output documents and stored in the compression dictionary (if paired with another symbol in a sequential pass) without a pass identifier.

Alternative embodiments achieve further space savings in a similar way. For any given pass after the first pass, an embodiment can omit the pass identifier of replacement symbols that are most frequently paired with another symbol. For example, in Pass X, symbol pairs can be formed by pairing a replacement symbol from any of Passes 1, . . . , N, . . . , X−1 with another symbol. Suppose that, in Pass X, replacement symbols from pass N are most frequently paired with other symbols. In that case, rather than storing, in the compression dictionary, the full replacement symbol for Pass N replacement symbols, the embodiment omits the pass identifier from Pass N replacement symbols and simply stores an indication that Pass N is the most frequent pairing for Pass X. Thus, if any symbol pair stored in Pass X's section of the compression dictionary contains a replacement symbol with no pass identifier, the pass identifier is assumed to be that of Pass N. In this manner, space is saved because Pass N's pass identifier need only be stored once for all of the entries stored in the compression dictionary during Pass X.

The example embodiment of FIG. 2 only uses replacement symbols if their associated count exceeds a predetermined threshold. Every symbol pair in the document that corresponds to an entry in compression dictionary could be replaced (e.g., a threshold equal to one). However, a higher threshold allows for improved performance. If a large number of symbol pairs appear only once or only a few times, their replacement will not improve, or significantly improve, compression of the documents and will increase the storage requirements of the compression dictionary. A higher threshold can reduce processing time by eliminating the need to replace infrequently used symbol pairs.

The example embodiment improves space savings further by only retaining compression dictionary entries for symbol pairs that have a count exceeding the threshold. Because the example embodiment is programmed to perform the cataloging phase on all documents before beginning the replacement phase, symbol pairs that do not exceed the threshold will not be replaced. Thus, storing below-threshold symbol pairs increases the size of the compression dictionary without providing any without benefit. To avoid that inefficiency, the example embodiment truncates (i.e., deletes portions of) the compression dictionary having entries with counts less than the threshold. For example, if the threshold for the first pass is four, the example embodiment would not retain portion 260 of FIG. 2.

Alternative embodiments retain portions of the compression dictionary with entries that have a count less than the threshold even though they will not be used with the current set of documents. If new documents are added to the set of documents, the counts for below-threshold symbol pairs could increase to the point where they meet the replacement threshold. Some alternative embodiments store below-threshold portions of the compression dictionary in a separate archive rather than the compression dictionary. The archive can be accessed when new documents are added.

In various embodiments, the replacement symbols can be associated with a symbol pair when the symbol pair is first identified or meets the replacement threshold. The example embodiment assigns replacement symbols after both sorting and truncation so that the most frequently used replacement symbols will have the shortest length and can be placed in the most accessible memory locations. In circumstances where a replacement symbol is the address of its associated symbol pair, each replacement symbol is associated with its symbol pair by virtue of the symbol pair's position in the sort order.

Alternative embodiments can assign replacement symbols any time before the replacement phase begins. Such alternative embodiments can sort the compression dictionary based on the counts or maintain the entries in their original order. After sorting, some embodiments delete the counts to save additional space.

During the replacement stage of a pass, the example embodiment creates a compressed output document by replacing symbol pairs in an input document with replacement symbols from compression dictionary 200. Alternative embodiments create a new output document distinct from the input document by inserting either the original symbols or replacement symbols in place of a pair of the original symbols. Such alternative embodiments later delete the input document. The example embodiment creates output document 321 (see FIG. 3) by overwriting symbol pairs in input document 111 with replacement symbols where appropriate.

The compression dictionary for the example embodiment only contains entries for symbol pairs that exceed the replacement threshold because entries with counts not exceeding the threshold were not retained. Thus, the example embodiment is programmed to replace the first symbol pair that matches an entry in the compression dictionary. When processing document 111, the example embodiment identifies the pair of symbols 311 and 312 (FIG. 3) and compares it to the entries of compression dictionary 200 (FIG. 2). The pair of symbols 311 and 312 is found in compression dictionary 200 (see entry 212). Because a match is found, the pair of symbols 311 and 312 is replaced with replacement symbol 325 in output document 321. The dictionary also contains the pair of symbols 312 and 313 (see 214), and the count exceeds the threshold for replacement (see 215). However, the pair of symbols 312 and 313 is not considered for replacement, because the example embodiment already replaced symbol 312.

Embodiments that do not truncate the compression dictionary must compare symbol pairs in a document to the compression dictionary and also check the count before replacement. Alternative embodiments analyze multiple possible replacements to determine which would maximize the number of total replacements or maximize the space savings. Other embodiments determine which pairs to replace based on minimizing the length of the replacement pairs or the lookup time required to decompress the document. Still further alternative embodiments attempt to replace the first pair of symbols and, if no replacement is possible, skip over the pair that could be formed by combining the second symbol of the first pair with the next sequential symbol.

When the example embodiment cannot replace a symbol pair, it continues to consider the next symbol pair. For example, when the pair of symbols 315 and 316 is compared to the entries in the compression dictionary, no match is found. The example embodiment, therefore, moves to the next symbol pair (the pair of symbols 316 and 317). Embodiments that create a new output document, rather than overwriting the symbols of the input document, insert into the output document the first symbol of a symbol pair that cannot be replaced. If that last symbol of a symbol pair is the last symbol in a document, and if the symbol pair does not match any of the entries in the compression dictionary, both symbols of the symbol pair must be inserted into the output document.

As described, the example embodiment is programmed to perform recursive passes until no further replacements are possible. Thus, the example embodiment begins a second pass by applying cataloging and replacement phases to document 321 to produce document 331. In the symbology of FIG. 3, symbol "R3P2" in document 331 refers to row 3 of the second pass. Symbol pairs identified in a second or subsequent pass can be two replacement symbols. See replacement symbol 335, which refers to the sequence of replacement symbol R4 (see 325) followed by replacement symbol R3 (see 326 in the first pass in document 321). Alternatively, symbol pairs identified in a later pass can be a combination of a replacement symbol and an uncompressed symbol. See replacement symbol 336, which refers to the sequence of uncompressed symbol S300 followed by replacement symbol R3. Compression dictionary 200 of FIG. 2, therefore, lists in row R3 of column 220 (P2) the sequential pair R4 followed by R3. Review of column 210 reveals that the sequence R4 followed by R3, in turn, denotes symbol S1 followed by S79 followed by S75 followed by S5. Thus, in this example, after the second pass (P2), the example embodiment has replaced the four-symbol "phrase" S1-S79-S75-S5 with the single symbol R3P2.

Sequential passes by the example embodiment result in additional columns 220 and 230 (FIG. 2) that store symbols pairs from each respective pass. In the example embodiment, each pass in which unique symbol pairs are discovered results in additional columns being added to compression dictionary 200 to store the newly identified symbol pairs and their respective counts (see columns 221 and 231). FIG. 2 presents symbols discovered in later passes in separate columns to illustrate the recursive nature of the embodiment.

The example embodiment only makes replacements from the column or section of compression dictionary 200 created during the instant pass. Storing replacement symbols in pass-specific sections reduces lookup times because the embodiment does not need to search through entries having replacement symbols that will not be used in the current pass.

Alternative embodiments store symbol pairs identified in different passes in a common column or memory area. Such embodiments can increase space savings because they use less complex replacement symbols. For example, an embodiment that stores all identified symbol pairs in the same column of the compression dictionary could use a replacement symbols that consists entirely of a row identifier. In any embodiment, close attention to the choice of symbology for the replacement symbol is capable of producing increased compression.

As shown in FIG. 3, a third pass performed on document 331 produces document 341, and a fourth pass performed on document 341 produces document 351. If the output of fourth pass (document 351) is the same as the output of the third pass (document 341), and assuming this remains true for all other documents that are being compressed concurrently with document 111, then the example embodiment stores the last output version of each document, and the compression process terminates. The example presented in FIG. 3 only shows four passes of the process applied to the example text. However, any number of passes can be performed. In some embodiments, the number of passes can be a fixed number. In other embodiments, a maximum number of passes can be set, but the process is programmed to terminate if no further replacements are made before the cap is reached.

As more passes are performed on a set of documents, the number of symbol pairs identified and the count of each identified symbol pair tends to decrease, hence the incremental size reduction provided by each additional pass decreases. However, each additional pass will consume additional processing resources. To balance the size reduction against processing resources, certain embodiments are programmed to terminate the process if the size reduction resulting from a given pass falls below a certain limit (e.g., if a given pass produces less than a half of a percent size reduction). Other embodiments terminate the process based on a different factor, such as the number of new symbol pairs found being less than a fixed amount or the count of the most frequently occurring symbol pair falling below a certain level. In another example, an embodiment can be constructed to terminate the process if the count of the most frequently occurring symbol pair in a pass falls below a predetermined percentage of the count of the most frequently occurring symbol in the first pass.

Once the criterion for terminating the process has been met, some embodiments are programmed to replace any identified symbol pairs found in the pass that triggered the termination condition. Other embodiments terminate the process immediately upon recognizing the termination condition, without replacing symbol pairs found in that last pass. Still further embodiments terminate mid-pass if an insufficient number of symbol pairs are found after processing enough text to determine that the resultant space savings would fall below a predetermined amount. Any symbol pairs that are not replaced would not need to be stored in the compression dictionary or assigned a replacement symbol.

Compression dictionary 200 can grow to have any number of columns depending on the number of passes performed on a plurality of documents. Thus, FIG. 2 only shows a portion of compression dictionary 200 relevant to documents 310-350.

The example embodiment performs sort and truncation operations at the end of each cataloging phase. However, thresholds applied during successive passes can differ from the threshold of the first pass. The example embodiment uses lower replacement thresholds for additional passes.

Some embodiments determine ideal values for the replacement thresholds of each pass by compressing a subset of the documents in a series of trials with different pass thresholds values in each trial until the best compression is achieved.

Figure 4:
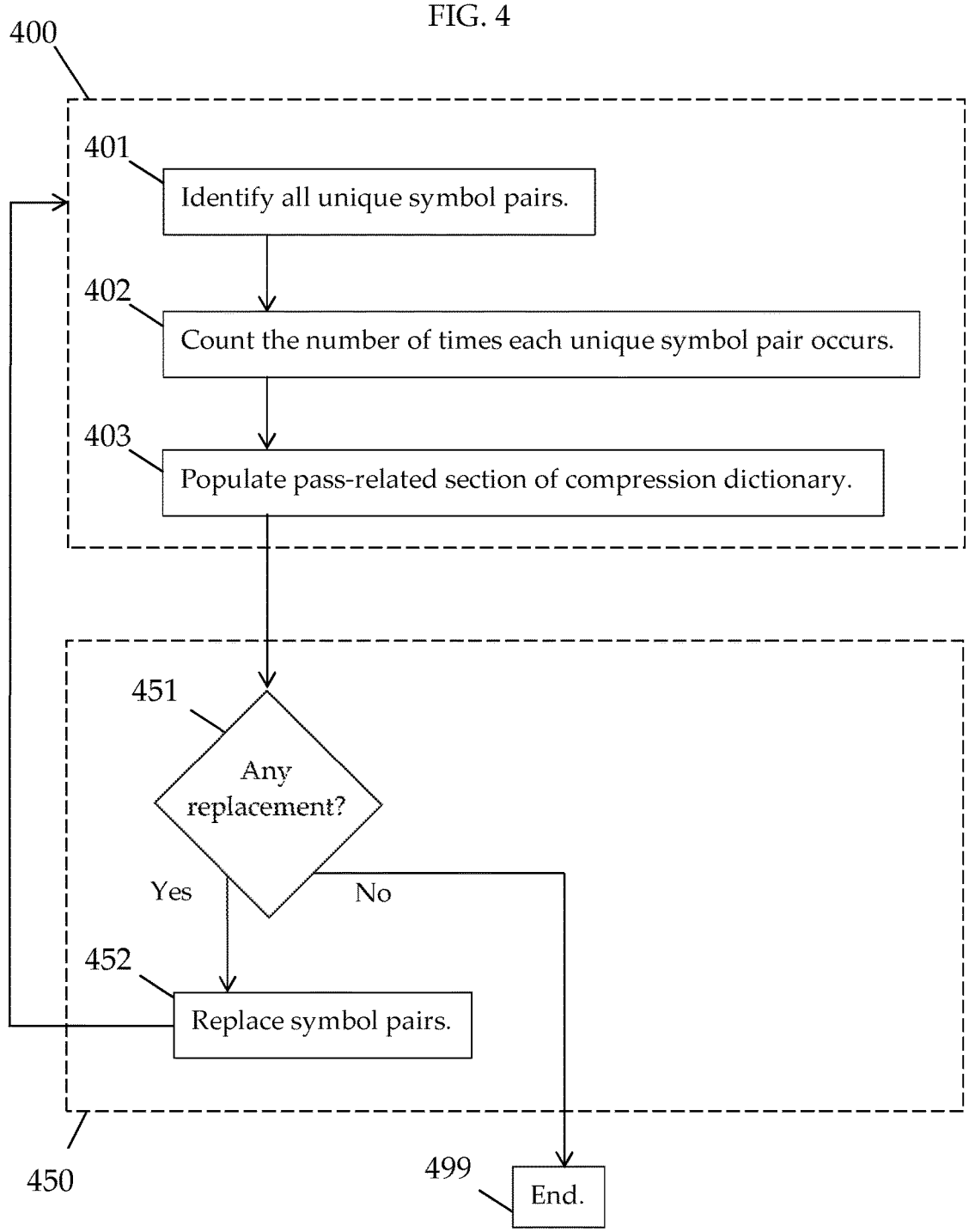
FIG. 4 is a flowchart that shows the operation of the embodiment of FIG. 2.

FIG. 4 is a flowchart showing the operation of the example embodiment. Cataloging phase 400 for any pass begins with identifying all unique symbols (401). Next, the example embodiment counts the number of occurrences of each unique symbol (402). Next, the example embodiment populates the compression dictionary with the unique symbols (403). Populating the compression dictionary can include reordering the unique symbol pairs based on their counts, omitting symbol pairs with counts that do not exceed the threshold, and associating replacement symbols with each unique symbol pair. The example embodiment completes cataloging phase 400 on all documents before moving to replacement phase 450.

During replacement phase 450, the example embodiment searches the input documents for symbol pairs that match entries in the compression dictionary (451). If any replacements are possible, the example embodiment replaces symbol pairs with an associated replacement symbol (452). The example embodiment enforces the threshold at 403 by populating the compression dictionary with only symbol pairs that exceed the threshold; however other embodiments that retain symbol pairs with counts that do not exceed the threshold enforce the threshold by only replacing symbols pairs with counts exceeding the threshold. After replacements are made (452), the example embodiment operates recursively by returning to cataloging phase 400 to begin a subsequent pass on the output of the previous pass. As part of the recursion process, the example embodiment adjusts the replacement threshold (not shown) according to the settings for the subsequent pass. If no replacements are possible during a pass, the example embodiment stores the compressed output documents and terminates (499). When required, the example embodiment restores the compressed documents by reversing the replacement phase of each pass.

The example embodiment handles new documents by decompressing all compressed documents, deleting the compression dictionary, and with the new documents as part of the plurality of documents, re-applying the process (i.e., 400-499) to the uncompressed documents. Compression of new documents can be scheduled for times when resource demand is expected to be low or by an offline system so that users do not experience noticeable delays when accessing compressed documents.

Alternative embodiments handle new documents by recursively applying cataloging and replacing passes to new documents without uncompressing any documents. In such embodiments, compression is improved if the compression dictionary is not truncated because symbol pairs identified in new documents could cause the count a particular replacement symbol that did not previously meet the replacement threshold to exceed the threshold and used in the new document.

Other embodiments recursively apply only the replacement phase to the new documents. For such embodiments, the documents in an original set of documents can act as a training set.

The process works best with large volumes of data. The more data that is compressed, the more likely it is that long sequences of symbols will be repeated. Thus, higher compression ratios can be achieved as the number of symbols increases. In that way, processes described with reference to the above embodiments are well suited to "big data" applications. In fact, the disclosed embodiments can result in greater data size compared to existing techniques if applied to very small data sets, in part because of overhead associated with the compression dictionary.

Likewise, if the plurality of documents includes only documents from a particular field of knowledge, the process can produce improved compression ratios because any given field of knowledge has common terms and phrases that are often repeated in texts dedicated to the field. On the other hand, when documents from a new field of knowledge are incorporated into the plurality of documents, the process encounters a learning curve in which the achievable compression ratio is decreased. Eventually, after processing a sufficient number of documents in a new field, the system can "learn" the terms of art from the new field, and the compression ratio improves.

Figure 5:
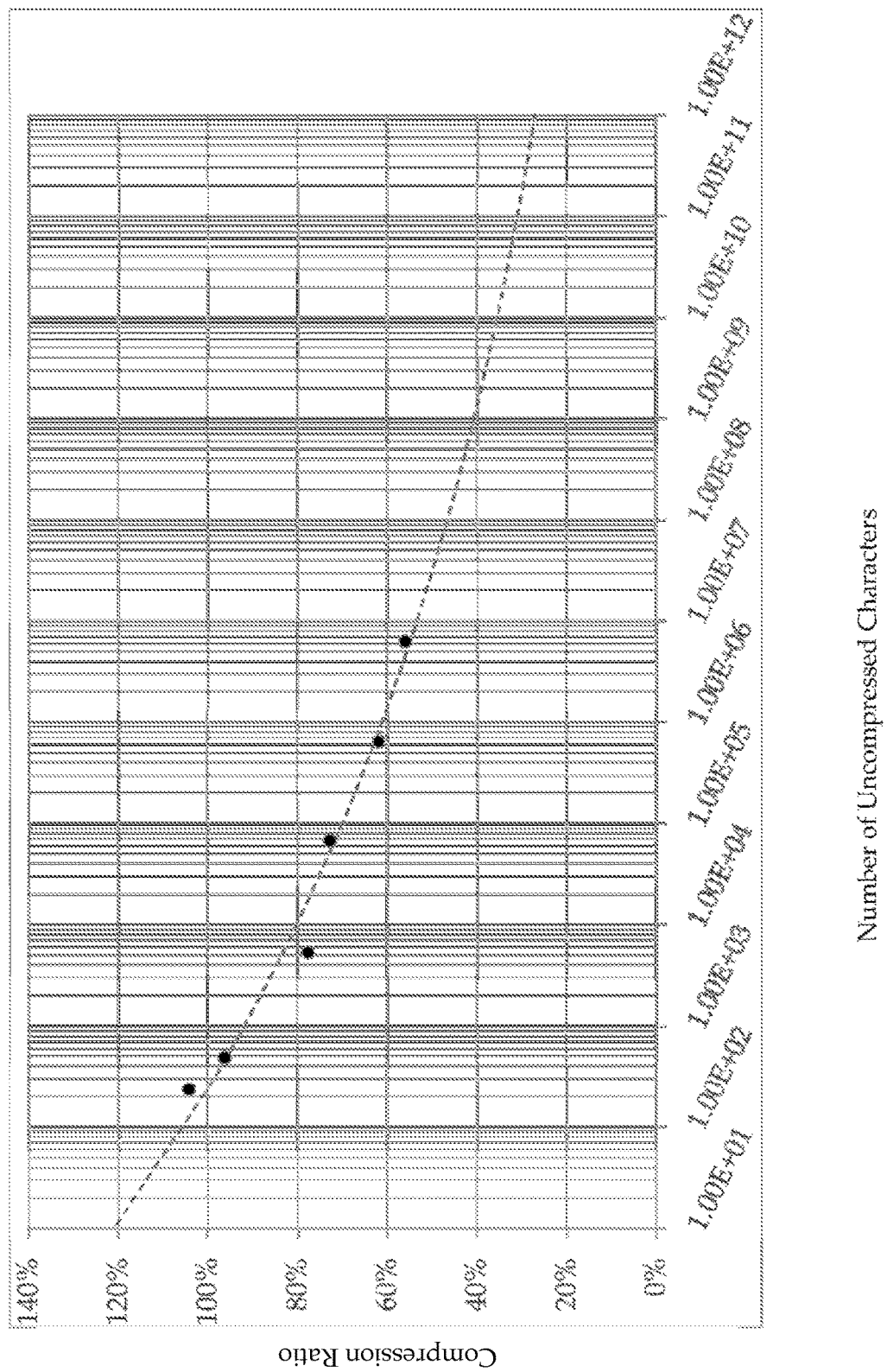
FIG. 5 is a chart showing results achieved by an experimental embodiment.

FIG. 5 summarizes experimental results of one embodiment. The experimental embodiment was programmed to identify each word in the input documents as a symbol. The experimental embodiment applied standardization to input documents, and both sorted and truncated the sections of the compression dictionary relating to a particular pass after the cataloging phase of that pass. The documents used in the experiment were abstracts from 15,000 randomly selected US patents (a little over one million words). Before the experimental embodiment was applied to the documents, all non-alphanumeric characters were removed, and all uppercase characters were converted to lowercase characters.

To test the premise that compression rates improve as data size increases, the experimental embodiment was applied to six different-sized groupings of documents. Table 1 details the size of each group and the achieved compression ratio. The data in Table 1 is plotted in FIG. 5 with the number of characters plotted on the x-axis (in log scale) and the compression ratio plotted on the y-axis. The dashed line in FIG. 5 represents a trend line based on a power regression of the data in Table 1.

TABLE 1

| Characters in Input Docs | Compression Ratio |
| --- | --- |
| 234 | 104.27% |
| 487 | 96.30% |
| 5,280 | 77.75% |
| 66,864 | 72.89% |
| 640,621 | 61.96% |
| 6,290,146 | 56.09% |

Compression ratio for the experimental results is expressed as a percentage and indicates the size of the compressed data as a percentage of the uncompressed data. In other words, compression ratio (in percent) equals the number of compressed characters divided by the number of uncompressed characters multiplied by 100. The number of compressed characters includes the number of compressed characters in the output documents plus the number of characters in the compression dictionary.

The experimental embodiment was able to improve upon the compression ratio achievable by Byte-Pair Encoding, which is at best 60% when applied to English language texts. Shibata Y. et al. (2000) Speeding Up Pattern Matching by Text Compression. In: Bongiovanni G., Petreschi R., Gambosi G. (eds) Algorithms and Complexity. CIAC 2000. Lecture Notes in Computer Science, vol. 1767. Springer, Berlin, Heidelberg. Ultimately, the experimental embodiment achieved a compression ratio of 56.09% when applied to the full sample of approximately one million words.

The system and process can apply to various applications, for example, compression of archives such as email, news, or other library archives. The process is well suited to such applications because the large number of the symbols involved is likely to produce a significant number of repeated strings, facilitating a high level of compression. Additions to the archive can be scheduled to occur during off-peak hours and can be structured in large batches as to best balance the required processing time against the space savings achieved by compression of the added documents.

The trend line in FIG. 5 suggests that, if the system is applied to a large enough data set, the compression ratio is likely to continue to improve. The trendline crosses below 40% at around a billion characters and below 30% at around a trillion characters. Wikipedia is an example that could provide a sense of the scale at which the compression ratio is likely to be most effective. In 2015, Wikipedia's English-language version was estimated to contain approximately 23 billion characters. In November 2009 (the last month in which Wikipedia released statistics on word count across all languages), Wikipedia (all languages) had approximately six billion words and was growing at a rate of one billion words every nine months. Assuming six characters per word, Wikipedia (all languages) therefore had thirty-six billion characters in November 2009. Assuming that such a growth rate has persisted, Wikipedia (all languages) is estimated to have approximately 16 billion words or one trillion characters in March 2017. Thus, a person desiring to archive a data set on the scale of Wikipedia could benefit from compression using this process.

Applications directed to cloud-based email and messaging systems could also benefit from the process because such systems have many users. Many of the emails are likely to be replies to and messages forwarded from other users. Such messages often include all or portions of the original message, which results in very long strings of duplicated symbols that the process can sometimes replace with as little as a single replacement symbol.

Certain replacement symbols that are generated after many successive passes replace long strings of text. If two compressed documents have such higher-order replacement symbols in common, a relationship between the documents can be deduced. As described above, authors of works in a particular field tend to repeat phrases and terminology unique to the field and works. A particular author can utilize a number of common phrases, concepts, and story characters frequently discussed by that author. In such situations, two works can be identified as related based on such commonalities. The commonalities could be used to group the documents together as a collection, to identify certain documents as derivative of other documents, or to suggest works to a reader based on the reader's interest in a particular field or a particular author. Such embodiments are particularly useful to a user who is unfamiliar with a field or in situations where the actual author is difficult to identify (e.g., a ghost author or a plagiarist).

The process can be applied to analyze any data that can be codified. For example, characteristic of the human face can be codified into a set of measurements (size of each eye, the separation between the eyes, eye color, the length of the brow, etc.). Those measurements could be coded or classified, formatted, and assembled into a document, using a consistent order. In such a manner, the compression process can be applied to a set of documents, where each document contains a plurality of measurements of a particular person's facial structure. After the documents are compressed, a system could perform facial recognition by comparing the replacement symbols in the compressed documents. Because higher-order replacement symbols represent long chains of symbols, the fact that two documents both have one or more of the same higher-order replacement symbols indicates a high likelihood that the faces, represented by the measurement in the documents, are from the same person.

A match between two documents can be determined based on the total number of matching higher-order replacement symbols exceeding a threshold. Alternative embodiments of the facial recognition system can select the closest match or matches and value indicating the degree of confidence in each match.

Such a facial recognition system could be used, for example, to control access to a secure location. The secure location can be a physical place (e.g., a building) or a device (e.g., a computer system, database, or secured portion thereof). An alternative use could be to determine the identity of an unknown person. Another alternative use is merely distinguishing whether or not certain measurements represent a human face or not.

In the case of controlling access to a secure location, an example embodiment would first use the compression process, as described herein, to compress a set of documents, each representing one of a group of known and authorized persons, and to produce a compression dictionary. Later, when requesting access to the secure entity, an unknown person initiates a process by which measurements are taken of his or her face. The unknown person's face could be measured by a non-invasive method (e.g., calculating the required values from an image captured by one or more cameras). The required values are then arranged into a new document that is compressed using the same compression dictionary. The system compares the replacement symbols in the compressed version of the new document to those contained in the previously compressed documents and outputs the results (e.g., just that a match exists and access should be granted or more specifically the believed identity of the unknown person). In some embodiments, the system can have the unknown person purport to identify himself or herself by other means, such as through voice announcement or a card swipe, and check the document containing information derived from the captured image of the unknown person's face against only the document containing pre-stored information about the person that the unknown person claimed to be. In other embodiments, the system can compare the document containing the captured image of the person's face against all documents containing pre-stored information about all authorized persons.

In the facial recognition system, the symbology of facial measurements in the documents can be exact numerical measurements (e.g., pupillary separation=64.57 mm or eye color (RGB)=161, 202, 241). Use of exact measurements can produce a high degree of certainty in any match that is found but is also likely to result in false negatives. Slight variances in the measurement conditions or equipment calibrations over time could result in misidentification. Thus, it is advisable that the symbology use approximate measurements or values representing ranges in which the measurements fall. The symbology of the ranges can include numerical values of the range, an average value for the range, or an arbitrary symbol that represents the range.

Each facial recognition document needs to have a sufficient number of measurements to avoid misidentification. Too few measurements results in a risk of falsely identifying a match. Another use of the facial recognition process is to investigate and improve facial recognition systems based on the process discussed herein, because by analyzing a sufficiently large set of documents representing known faces, the system can be used to determine how many measurements are required and the optimal order or groupings of measurements necessary to produce sufficient points of comparison.

Other practical applications of the process use recognized commonalities in compressed documents to analyze the content of the documents. Symbol pairs that are counted and associated with replacement symbols have an underlying meaning. Thus, thoughts, preferences, or other information about the author or subject of a document can be inferred from the symbol pairs. Data collected during the cataloging phase can provide a wealth of information of such information.

Embodiments with extended functionality could utilize the process to learn more about the content of text by noticing certain replacement symbols associated with a particular noun or verb. For example, such a system could tag or remember certain replacement symbols that contain words of interest in the symbol pair denoted by the replacement symbol. Symbol pairs that include words such as "love" or "like," for example, can result in the associated replacement symbol being tagged in a way indicating that the symbol pair expresses a positive emotion. Symbol pairs that include words such as "hate" or "despise," by contrast, can result in the associated replacement symbol being tagged in a way indicating that the symbol pair expresses a negative emotion. For another example, symbol pairs containing nouns could be classified according to an area of interest, e.g., pets, family members, or products.

Using such tagging, based on the proximity of or sequence in which a pair or a set of tagged replacement symbols occurs in the compressed text, the process can infer a feeling expressed by the author about a particular entity or concept. For example, if a tagged replacement symbol indicating positive emotion is found in proximity to a tagged replacement system indicating pets, or just in proximity to a specific word like "dogs," then the system can infer that the author likes pets, or likes dogs. Tracking specific descriptive words can provide a more granular understanding of the concepts expressed by a particular author (e.g., a love of small dogs as opposed to love of dogs generally without regard to size). In such embodiments, replacement symbols assigned during later passes can inherit attributes assigned to earlier-assigned replacement symbols that make up the symbol pair associated with the later-assigned replacement symbol. For example, if a P2 replacement symbol is tagged as being a "positive emotion" indicator, and a different P2 replacement symbol is tagged as being a "pets" indicator, then in Pass 3, a P3 replacement symbol that includes both P2 replacement symbols can be tagged as indicating "loves pets." In this manner, repeated occurrences of higher-order replacement symbols among different authors can indicate a common interest. If works of two different authors contain that same P3 replacement symbol, they may share a common love of pets.

An implementation of one example embodiment is used in connection with an email archive. Analysis of emails drafted by a particular author or a working group is used to identify the author's or the group's preferences, such as products, restaurants, cities, etc. that the author likes. An author that frequently combines words expressing positive feelings with words referencing a particular type of animal might be identified as potentially owning such an animal. The example embodiment then provides the associations determined from such analysis to a system for making recommendations of products or advertising to the user.

It is intended that equivalents of the disclosed example embodiments and methods shall fall within the scope of the present disclosure or appended claims. It is intended that the disclosed example embodiments and methods, and equivalents thereof, can be modified while remaining within the scope of the present disclosure or appended claims.

In the foregoing Detailed Description, various features can be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Thus, the appended claims are hereby incorporated into the Detailed Description, with each claim standing on its own as a separately disclosed embodiment. Nor is the use of the term "embodiments" intended to imply any exclusion of features discussed in connection with other embodiments. Rather, features from one embodiment or group of embodiments can be combined with features from any other embodiment or group of embodiment unless clearly inconsistent therewith. Therefore, the present disclosure shall also be construed as implicitly disclosing any embodiment having any suitable set of one or more disclosed or claimed features (i.e., a set of features that are neither incompatible nor mutually exclusive) that appear in the present disclosure or the appended claims, including those combinations of features that may not be explicitly disclosed in combination in any particular embodiment. It should be further noted that the scope of the appended claims does not necessarily encompass the whole of the subject matter disclosed herein.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure and appended claims, the words "comprising," "including," "having," and variants thereof, wherever they appear, shall be construed as open-ended terminology, with the same meaning as if the phrase "at least" were appended after each instance thereof.

In the appended claims, if the provisions of 35 USC § 112 ¶6 are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112 ¶6 are not intended to be invoked for that claim.

If any one or more disclosures are incorporated herein by reference and such incorporated disclosures conflict in part or whole with, or differ in scope from, the present disclosure, then to the extent of the conflict, broader disclosure, or broader definition of terms, the present disclosure controls. If such incorporated disclosures conflict in part or whole with one another, then to the extent of the conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim.

APPENDICES

The first appendix is computer code (Microsoft Visual Basic for Applications 7.1 in Microsoft Excel 2016) for one implementation of the compression process wherein the symbols operated on are words.

The second appendix is computer code (Microsoft Visual Basic for Applications 7.1 in Microsoft Excel 2016) for one implementation of the compression process wherein the symbols operated on are alphanumeric characters.

What is claimed is:

1. A computerized method of compressing symbolic information organized into a plurality of documents, each document having a plurality of symbols, the method comprising:
    (a) with a first document of the plurality of documents as an input document, automatically with a computer:
        (i) identifying a plurality of symbol pairs, each symbol pair consisting of two sequential symbols in the input document; and
        (ii) for each unique symbol pair of the plurality of symbol pairs, updating a count identifying the number of appearances of the unique symbol pair;
    (b) performing part (a) on each of the other documents of the plurality of documents, wherein the respective counts for the symbol pairs identifies the number of previous appearances of that symbol pair in any of the plurality of documents; and
    (c) after part (b), for at least one of the plurality of documents, producing a compressed document by causing the compressed document to include, at each position associated with one of the plurality of symbol pairs from the input document, a replacement symbol associated by a compression dictionary with the unique symbol pair matching the one of the plurality of symbol pairs, if the count for the unique symbol pair exceeds a threshold.

2. The method of claim 1 wherein the threshold is two.

3. The method of claim 1 further comprising sorting the compression dictionary in order of the count for the respective unique symbol pairs.

4. The method of claim 3 further comprising removing from the compression dictionary all unique symbol pairs having a count that does not exceed the threshold and making an association in the compression dictionary between each unique symbol pair having a count that exceeds the threshold and a replacement symbol.

5. The method of claim 1 further comprising performing an additional pass on the at least one of the plurality of documents by repeating parts (a) and (c) using as the input document the compressed document.

6. The method of claim 5 further comprising performing additional passes, until the compressed document created by one of the passes is unaltered from the compressed document created by the immediately previous pass.

7. The method of claim 1 wherein each symbol from the first document indicates a word.

8. The method of claim 7 further comprising, before part (a), creating the first document by replacing each word of a text document with a corresponding one of the plurality of symbols.

9. The method of claim 1 wherein each symbol in the first document indicates an alphanumeric character.

10. The method of claim 1 wherein each replacement symbol comprises an address of an entry in the compression dictionary, which entry stores the unique symbol pair associated with replacement symbol.

11. The method of claim 1 further comprising performing part (c) on each of the-plurality of documents.

12. The method of claim 1 further comprising, before part (c) is performed on any of the plurality of documents, making an association in the compression dictionary between each unique symbol pair and a replacement symbol if and only if the unique symbol pair has a count that exceeds the threshold.

13. The method of claim 1 further comprising, for each of the plurality of documents, performing at least one additional pass by repeating parts (a) and (c), using as the input document the compressed document, until the compressed document created by one of the passes is unaltered from the compressed document created by the immediately previous pass.

14. The method of claim 1 further comprising assigning the first document at least one of a plurality of attributes based on the frequency with which a replacement symbol associated with a unique symbol pair appears in an output document associated with the first document.

15. The method of claim 14 further comprising suggesting a related document of the other documents based on the at least one attribute of the first document and a parallel at least one attribute assigned to the related document based on the frequency with which a replacement symbol associated with a unique symbol pair appears in an output document associated with the related document.

16. A computer system having at least one processor capable of compressing symbolic information organized into a plurality of documents, each document having a plurality of symbols, the computer system programmed to:
   (a) with a first document of the plurality of documents as an input document, automatically with the processor:
      (i) identify a plurality of symbol pairs, each symbol pair consisting of two sequential symbols in the input document;
      (ii) for each unique symbol pair, update a count identifying the number of appearances of the symbol pair;
   (b) perform part (a) on each of the other documents of the plurality of documents, wherein the respective counts for the symbol pairs identifies the number of previous appearances of that symbol pair in any of the plurality of documents; and
   (c) after part (b), for at least one of the plurality of documents, produce a compressed document by causing the compressed document to include, at each position associated with one of the plurality of symbol pairs from the input document, a replacement symbol associated by a compression dictionary with the unique symbol pair matching the one of the plurality of symbol pairs, if the count for the unique symbol pair exceeds a threshold.

17. The computer system of claim 16, wherein the computer system is further programmed (i) to sort the compression dictionary in order of the count for the respective unique symbol pairs; (ii) to remove from the compression dictionary all unique symbol pairs having a count that does not exceed the threshold; and (iii) to make an association in the compression dictionary between each unique symbol pair having a count that exceeds the threshold and a replacement symbol.

18. The computer system of claim 16, wherein the computer system is further programmed to, for at least one of the plurality of documents, perform additional passes by repeating parts (a) and (c), using as the input document the compressed document, until the compressed document created by one of the passes is unaltered from the compressed document created by the immediately previous pass.

19. The computer system of claim 16, wherein the computer system is further programmed to, for each of the plurality of documents, perform additional passes by repeating parts (a) and (c), using as the input document the compressed document, until the compressed document created by one of the passes is unaltered from the compressed document created by the immediately previous pass.

20. The computer system of claim 16, wherein each symbol from the first document indicates a word, and wherein the computer system is further programmed to, before part (a), create the first document by replacing each word of a text document with a corresponding one of the plurality of symbols.

21. The computer system of claim 16, wherein each replacement symbol comprises an address of an entry in the compression dictionary, which entry stores the unique symbol pair associated with replacement symbol.

22. The computer system of claim 16, wherein the computer system is further programmed to, before part (c) is performed on any of the plurality of documents, make an association in the compression dictionary between each unique symbol pair and a replacement symbol if and only if the unique symbol pair has a count that exceeds the threshold.

23. The computer system of claim 16, wherein the computer system is further programmed to assign the first document at least one of a plurality of attributes based on the frequency with which a replacement symbol associated with a unique symbol pair appears in an output document associated with the first document.

24. The computer system of claim 16, wherein the computer system is further programmed to suggest a related document of the other documents based on the at least one attribute of the first document and a parallel at least one attribute assigned to the related document based on the frequency with which a replacement symbol associated with a unique symbol pair appears in an output document associated with the related document.

25. A computer-readable storage medium that is not a transitory propagating signal storing a set of computer instructions for compressing symbolic information organized into a plurality of documents, each document having a plurality of symbols, wherein the set of computer instructions, when executed on a computer, causes the computer, automatically:
   (a) with a first document of the plurality of documents as an input document:
      (i) to identify a plurality of symbol pairs, each symbol pair consisting of two sequential symbols in the input document;
      (ii) for each unique symbol pair, to update a count identifying the number of appearances of the symbol pair;
   (b) to perform part (a) on each of the other documents of the plurality of documents, wherein the respective counts for the symbol pairs identifies the number of previous appearances of that symbol pair in any of the plurality of documents; and (c) after part (b), for at least one of the plurality of documents, to produce a compressed document by causing the compressed document to include, at each position associated with one of the plurality of symbol pairs from the input document, a replacement symbol associated by a compression dictionary with the unique symbol pair matching the one of the plurality of symbol pairs, if the count for the unique symbol pair exceeds a threshold.

26. The computer-readable storage medium of claim 25, wherein the computer instructions, when executed on the computer, further cause the computer (i) to sort the compression dictionary in order of the count for the respective unique symbol pairs; (ii) to remove from the compression dictionary all unique symbol pairs having a count that does not exceed the threshold; and (iii) to make an association in the compression dictionary between each unique symbol pair having a count that exceeds the threshold and a replacement symbol.

27. The computer-readable storage medium of claim 25, wherein the computer instructions, when executed on the computer, further cause the computer to, for at least one of the plurality of documents, perform additional passes by repeating parts (a) and (c), using as the input document the compressed document, until the compressed document created by one of the passes is unaltered from the compressed document created by the immediately previous pass.

28. The computer-readable storage medium of claim 25, wherein the computer instructions, when executed on the computer, further cause the computer to, for each of the plurality of documents, perform additional passes by repeating parts (a) and (c), using as the input document the compressed document, until the compressed document created by one of the passes is unaltered from the compressed document created by the immediately previous pass.

29. The computer-readable storage medium of claim 25, wherein each symbol from the first document indicates a word, and wherein the computer instructions, when executed on the computer, further cause the computer to, before part (a), create the first document by replacing each word of a text document with a corresponding one of the plurality of symbols.

30. The computer-readable storage medium of claim 25, wherein each replacement symbol comprises an address of an entry in the compression dictionary, which entry stores the unique symbol pair associated with replacement symbol.

31. The computer-readable storage medium of claim 25, wherein the computer instructions, when executed on the computer, further cause the computer to, before part (c) is performed on any of the plurality of documents, make an association in the compression dictionary between each unique symbol pair and a replacement symbol if and only if the unique symbol pair has a count that exceeds the threshold.

32. The computer-readable storage medium of claim 25, wherein the computer instructions, when executed on the computer, further cause the computer to assign the first document at least one of a plurality of attributes based on the frequency with which a replacement symbol associated with a unique symbol pair appears in an output document associated with the first document.

33. The computer-readable storage medium of claim 25, wherein the computer instructions, when executed on the computer, further cause the computer to suggest a related document of the other documents based on the at least one attribute of the first document and a parallel at least one attribute assigned to the related document based on the frequency with which a replacement symbol associated with a unique symbol pair appears in an output document associated with the related document.

* * * * *